US012757415B2

(12) United States Patent
Chen et al.

(10) Patent No.: US 12,757,415 B2
(45) Date of Patent: Oct. 6, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventors: Chang-Yih Chen, Tainan City (TW); Kuo-Hsing Lee, Hsinchu County (TW); Chun-Hsien Lin, Tainan City (TW); Kun-Szu Tseng, Tainan City (TW); Sheng-Yuan Hsueh, Tainan City (TW); Yao-Jhan Wang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 404 days.

(21) Appl. No.: 18/370,402

(22) Filed: Sep. 20, 2023

(65) Prior Publication Data

US 2025/0072015 A1 Feb. 27, 2025

(30) Foreign Application Priority Data

Aug. 21, 2023 (TW) ................................. 112131327

(51) Int. Cl.

| | |
|---|---|
| ***H01L 21/68*** | (2006.01) |
| ***H10D 1/00*** | (2025.01) |
| ***H10D 1/66*** | (2025.01) |
| ***H10D 30/01*** | (2025.01) |
| ***H10D 30/62*** | (2025.01) |
| ***H10D 84/80*** | (2025.01) |

(52) U.S. Cl.

CPC ............... *H10D 1/66* (2025.01); *H10D 1/047* (2025.01); *H10D 30/024* (2025.01); *H10D 30/6211* (2025.01); *H10D 84/811* (2025.01)

(58) Field of Classification Search

CPC ........ H10D 1/66; H10D 1/047; H10D 30/024; H10D 30/6211; H10D 84/811; H10D 84/813; H10D 84/0158; H10D 84/038

USPC .......................................................... 257/296

See application file for complete search history.

(56) References Cited

U.S. PATENT DOCUMENTS

| | | | | |
|---|---|---|---|---|
| 8,174,058 | B2 | 5/2012 | Marshall et al. | |
| 8,896,067 | B2 * | 11/2014 | Bergendahl ........ | H10D 84/0158 438/479 |
| 8,987,823 | B2 * | 3/2015 | Cheng .................... | H10D 87/00 257/350 |
| 9,171,904 | B2 * | 10/2015 | Eneman ............. | H10D 84/0193 |
| 9,590,077 | B2 * | 3/2017 | Cheng .................... | H10D 62/60 |
| 9,590,104 | B2 * | 3/2017 | Liaw .................... | H10D 84/038 |
| 9,941,271 | B2 * | 4/2018 | Ponoth ................. | H10D 84/811 |
| 10,079,186 | B2 * | 9/2018 | Le ........................ | H10D 84/038 |
| 10,937,699 | B2 * | 3/2021 | Liaw .................. | H10D 84/0158 |
| 11,521,971 | B2 * | 12/2022 | Liu ........................ | H10D 30/43 |

(Continued)

*Primary Examiner* — Vu A Vu

(74) *Attorney, Agent, or Firm* — Winston Hsu

(57) ABSTRACT

A method for fabricating a semiconductor device includes the steps of first providing a substrate having a non-metal-oxide semiconductor capacitor (non-MOSCAP) region and a MOSCAP region, forming a fin-shaped structure on the MOSCAP region, forming a shallow trench isolation (STI) around the substrate and the fin-shaped structure, performing a first etching process to remove part of the STI on the MOSCAP region, and then performing a second etching process to remove part of the STI on the non-MOSCAP region and the MOSCAP region.

7 Claims, 7 Drawing Sheets

(56) References Cited

U.S. PATENT DOCUMENTS

| | | | |
|---|---|---|---|
| 2013/0056826 | A1 | 3/2013 | Liu et al. |
| 2013/0175618 | A1 | 7/2013 | Cheng et al. |

* cited by examiner

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly, to a metal-oxide-semiconductor capacitor (MOSCAP) device and method for fabricating the same.

2. Description of the Prior Art

Capacitor structure such as MOSCAP structures from semiconductor devices are typically incorporated from gate structure elements of metal-oxide semiconductor field effect transistors (MOSFETs). The fabrication of a typical MOSCAP structure could be accomplished by depositing a metal layer serving as a bottom electrode on a substrate, an insulating layer such as oxide layer on the bottom electrode, and a binary metal layer serving as top electrode on the oxide layer.

Typically, a thermal anneal process is conducted on the binary metal layer so that the metal layer could have adequate work function to be applied in MOSCAP devices. For instance, work function applied to MOSCAP in p-type and n-type MOS devices could be not less than 4.7 eV and not greater than 4.3 eV. However, the thermal anneal process conducted could induce transformations in layers other than the binary metal layer and results in chemical degeneration or physical embrittlement. Moreover, thermal treatment such as heating or thermal anneal processes conducted on other layers could also results in damages to binary metal layer having poor thermal instability. Accordingly, it becomes necessary to strictly control temperatures, duration, and atmospheres of thermal anneal process in fabricating MOSCAP structures, which not only increases difficulty but also cost of the process. Hence, how to come up with a novel MOSCAP device for resolving the above issues has become an important task in this field.

SUMMARY OF THE INVENTION

According to an embodiment of the present invention, a method for fabricating a semiconductor device includes the steps of first providing a substrate having a non-metal-oxide semiconductor capacitor (non-MOSCAP) region and a MOSCAP region, forming a fin-shaped structure on the MOSCAP region, forming a shallow trench isolation (STI) around the substrate and the fin-shaped structure, performing a first etching process to remove part of the STI on the MOSCAP region, and then performing a second etching process to remove part of the STI on the non-MOSCAP region and the MOSCAP region.

According to another aspect of the present invention, a semiconductor device includes a substrate having a non-metal-oxide semiconductor capacitor (non-MOSCAP) region and a MOSCAP region, a first fin-shaped structure and a second fin-shaped structure on the MOSCAP region, and a first gate electrode on the first fin-shaped structure and the second fin-shaped structure. Preferably, a bottom surface of the first gate electrode between the first fin-shaped structure and the second fin-shaped structure is higher than a bottom surface of the first gate electrode adjacent to the first fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
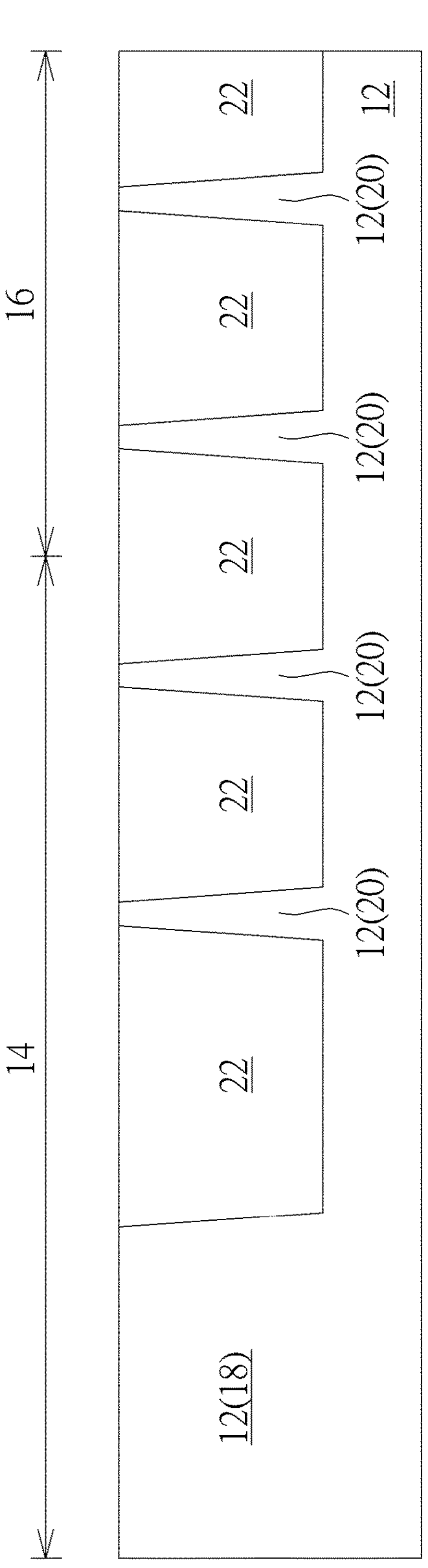
FIGS. 1-9 illustrate a method for fabricating a semiconductor device according to an embodiment of the present invention.

Referring to FIGS. 1-9, FIGS. 1-9 illustrate a method for fabricating a semiconductor device according to an embodiment of the present invention. As shown in FIG. 1, a substrate 12 such as a silicon substrate or silicon-on-insulator (SOI) substrate is provided and two or more regions including a non-MOSCAP region 14 and a MOSCAP region 16 are defined on the substrate 12, in which the non-MOSCAP region 14 could be used for fabricating input/output (I/O) devices of low-voltage (LV) devices while the MOSCAP region 16 could be used for fabricating a MOSCAP device in the later process.

Next, a base 18 and fin-shaped structures 20 are formed on the non-MOSCAP region 14 and a plurality of fin-shaped structures 20 are formed on the substrate 12 of the MOSCAP region 16. Preferably, the fin-shaped structures 20 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the base 18 and the fin-shaped structures 20 could also be obtained by first forming a patterned mask (not shown) on the substrate, 12, and through an etching process, the pattern of the patterned mask is transferred to the substrate 12 to form the base 18 and the fin-shaped structures 20. Moreover, the formation of the base 18 and the fin-shaped structures 20 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the base 18 and fin-shaped structures 20. These approaches for forming the base 18 and fin-shaped structures 20 are all within the scope of the present invention.

Next, a flowable chemical vapor deposition (FCVD) process is conducted to form an insulating layer (not shown) made of silicon oxide on the base 18 and the fin-shaped structures 20 and filling the trenches between the base 18 and the fin-shaped structures 20, and a planarizing process such as chemical mechanical polishing (CMP) process along with an etching process are conducted to remove part of the insulating layer for forming a shallow trench isolation 22. At this stage, the top surface of the STI 22 on the non-MOSCAP region 14 and MOSCAP region 16 is even with the top surface of the fin-shaped structures 20.

Figure 2:
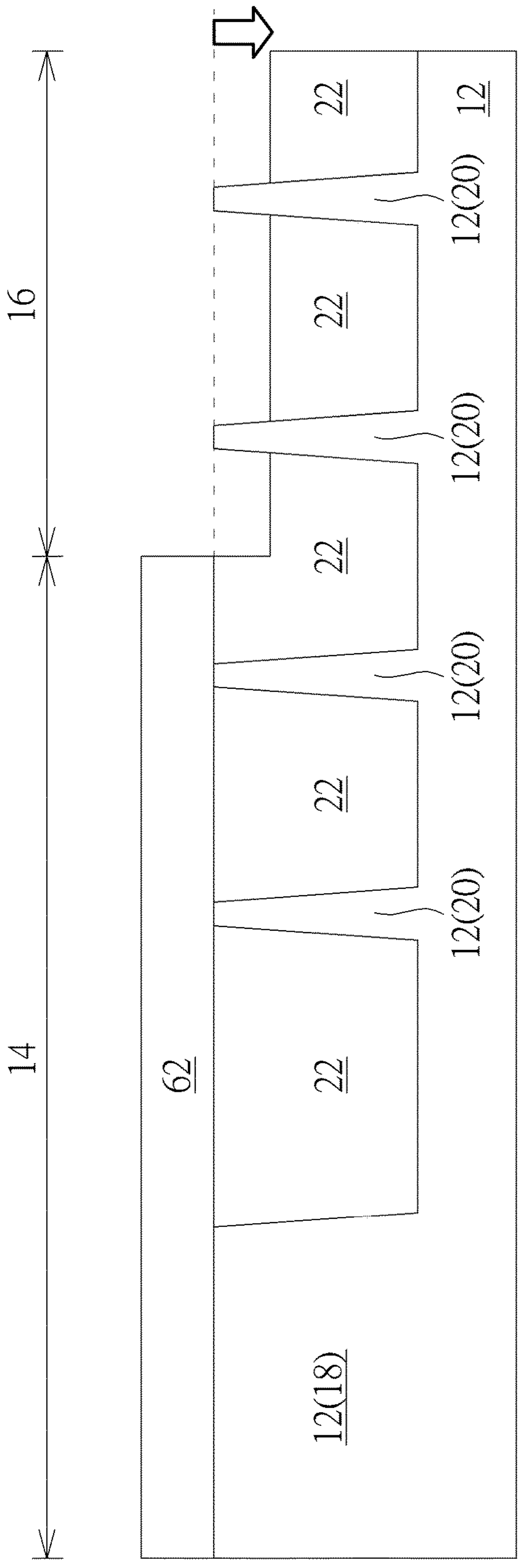

Next, as shown in FIG. 2, a patterned mask 62 such as a patterned resist is formed on the non-MOSCAP region 14 to expose the fin-shaped structures 20 and STI 22 on the MOSCAP region 16, and then an etching process is conducted by using the patterned mask 62 as mask to remove part of the STI 22 on the MOSCAP region 16 so that the top surface of the STI on the MOSCAP region 16 is slightly lower than the top surface of the STI and fin-shaped structures 20 on the non-MOSCAP region 14. Due to the coverage of the patterned mask 62, the top surface of the STI 22 on the non-MOSCAP region 14 is still even with the top surface of the fin-shaped structures 20 on the same region 14.

Figure 3:
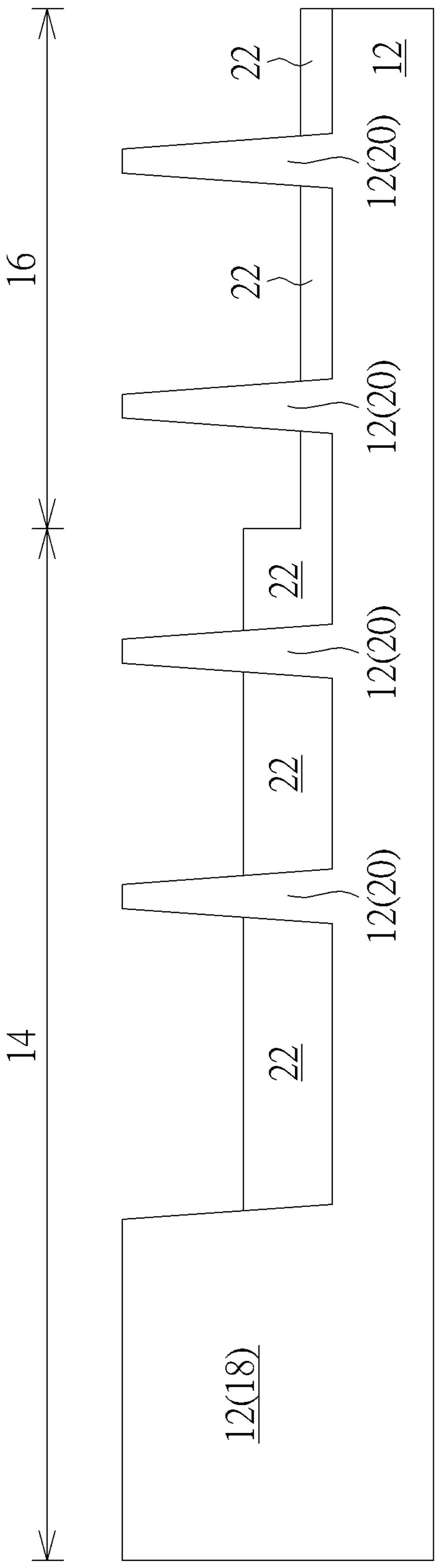

Next, as shown in FIG. 3, after stripping the patterned mask 62, another etching process is conducted without having any mask to remove part of the STI 22 on the non-MOSCAP region 14 and MOSCAP region 16 at the same time so that the top surface of the STI 22 on the MOSCAP region 16 is lower than the STI 22 on the non-MOSCAP region 14 while the top surface of the STI 22 on both non-MOSCAP region 14 and MOSCAP region 16 is lower than the top surface of the fin-shaped structures 22. It should be noted that even though part of the STI 22 is remained on MOSCAP 16 in this embodiment, according to other embodiment of the present invention it would also be desirable to remove all of the STI 22 on the MOSCAP region 16 and only remain some of the STI 22 on the non-MOSCAP region 14 during removal of the STI 22 on both the non-MOSCAP region 14 and MOSCAP region 16, which is also within the scope of the present invention.

Figure 4:
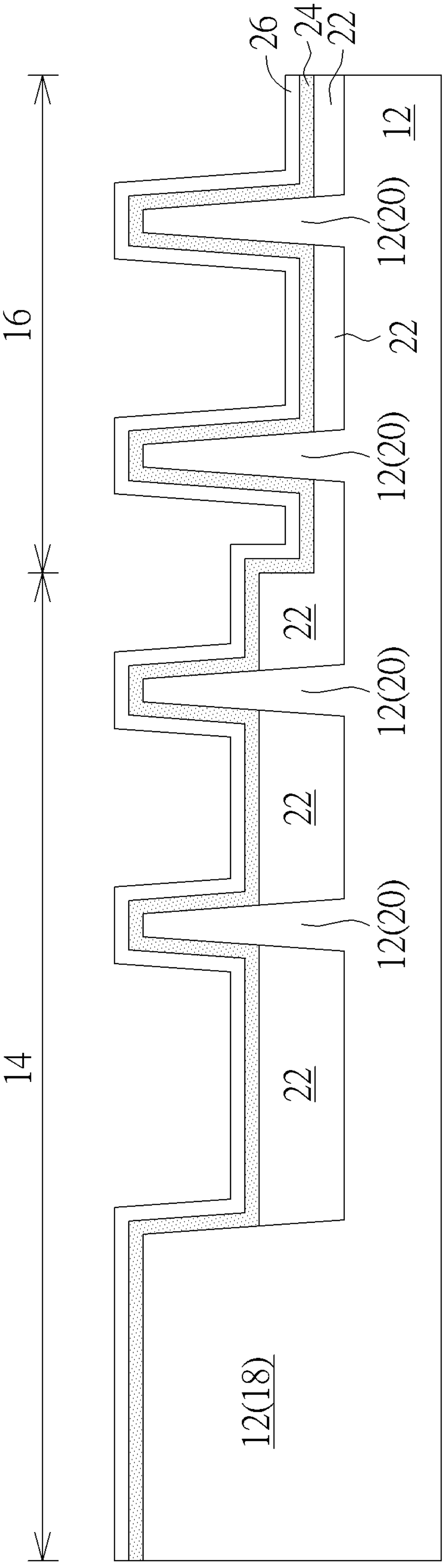

Next, as shown in FIG. 4, a doped layer 24 is formed on the substrate 12 of the non-MOSCAP region 14 and MOSCAP region 16 to cover the base 18 and fin-shaped structures 20, and then a cap layer 26 is formed on the surface of the doped layer 24. In this embodiment, the doped layer 24 preferably includes phosphosilicate glass (PSG) and the cap layer 26 includes silicon oxide.

Figure 5:
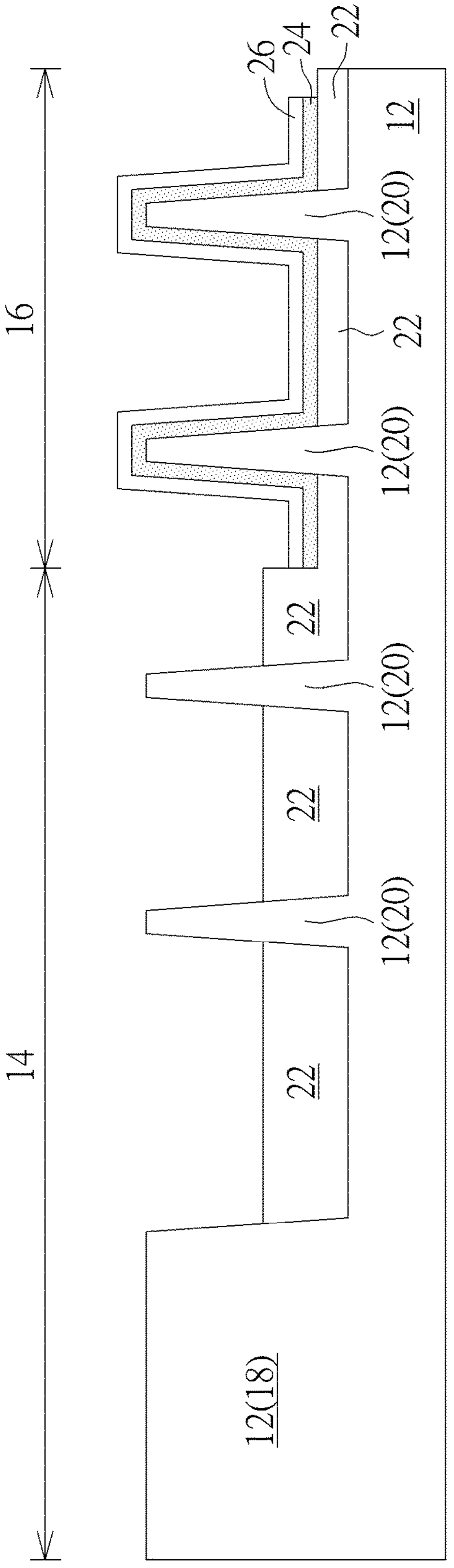

Next, as shown in FIG. 5, a photo-etching process is conducted by first forming a patterned mask (not shown) such as patterned resist on the MOSCAP region 16, and then conducting an etching process by using the patterned mask as mask to remove all of the cap layer 26 and doped layer 24 on the non-MOSCAP region 14 and even part of the cap layer 26 and doped layer 24 on the MOSCAP region 16 and expose the base 18 and fin-shaped structures 20 underneath. The patterned mask on the MOSCAP region 16 is then stripped thereafter.

Figure 6:
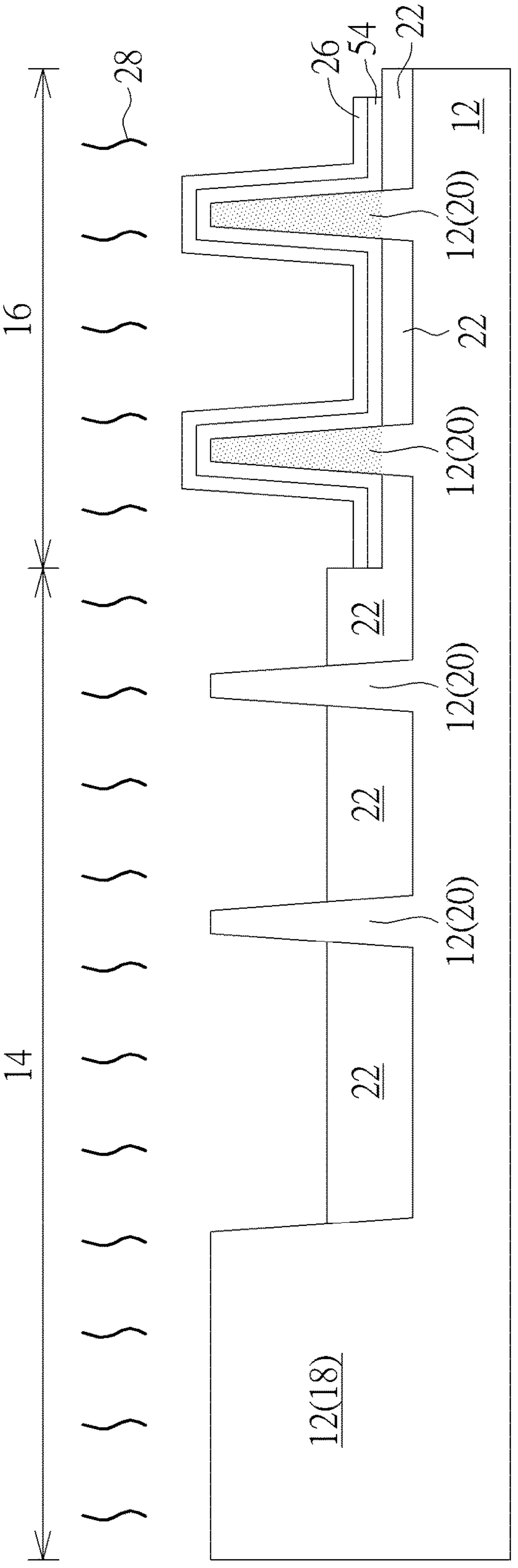

Next, as shown in FIG. 6, an anneal process 28 is conducted to drive the dopants such as phosphorus in the doped layer 24 into the fin-shaped structure 20 for forming a doped region (not shown) and at the same time transforms the doped layer 24 into a non-doped liner 54 made of silicon oxide. The doped region then becomes a bottom electrode for the MOSCAP device. Next, the cap layer 26 and the liner 54 having no dopant remaining could be removed or not removed depending on the demand of the process.

Figure 7:
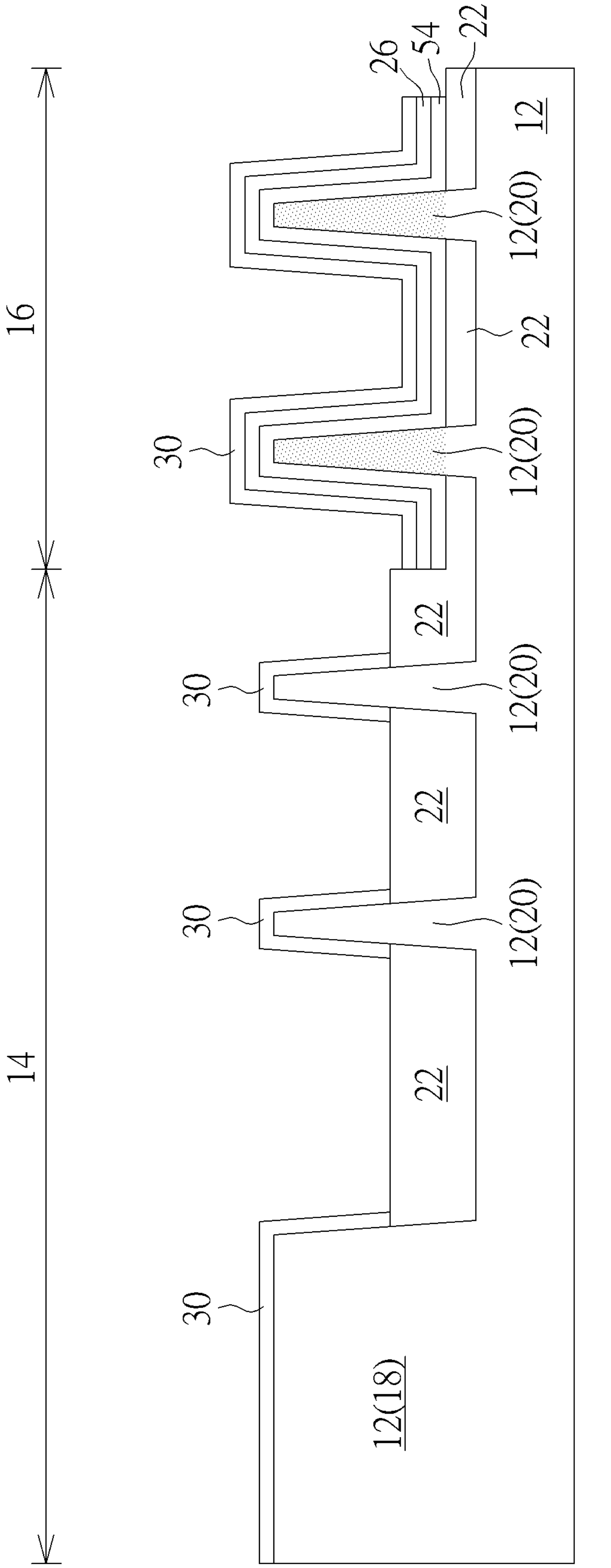

Next, as shown in FIG. 7, an oxide growth process such as a rapid thermal oxidation (RTO) process or an in-situ steam generation (ISSG) is conducted to form a gate oxide layer 30 made of silicon oxide on the substrate 12 and fin-shaped structures 20 on the non-MOSCAP region 14 and MOSCAP region 16. It should be noted that in contrast to the gate oxide layer 30 on the non-MOSCAP region 14 is disposed directly on the surface of the substrate 12 and fin-shaped structure 20, the gate oxide layer 30 on the MOSCAP region 16 could be disposed directly on the surface of the cap layer 26 or fin-shaped structures 20 depending on whether the cap layer 26 and the liner 54 are removed.

Figure 8:
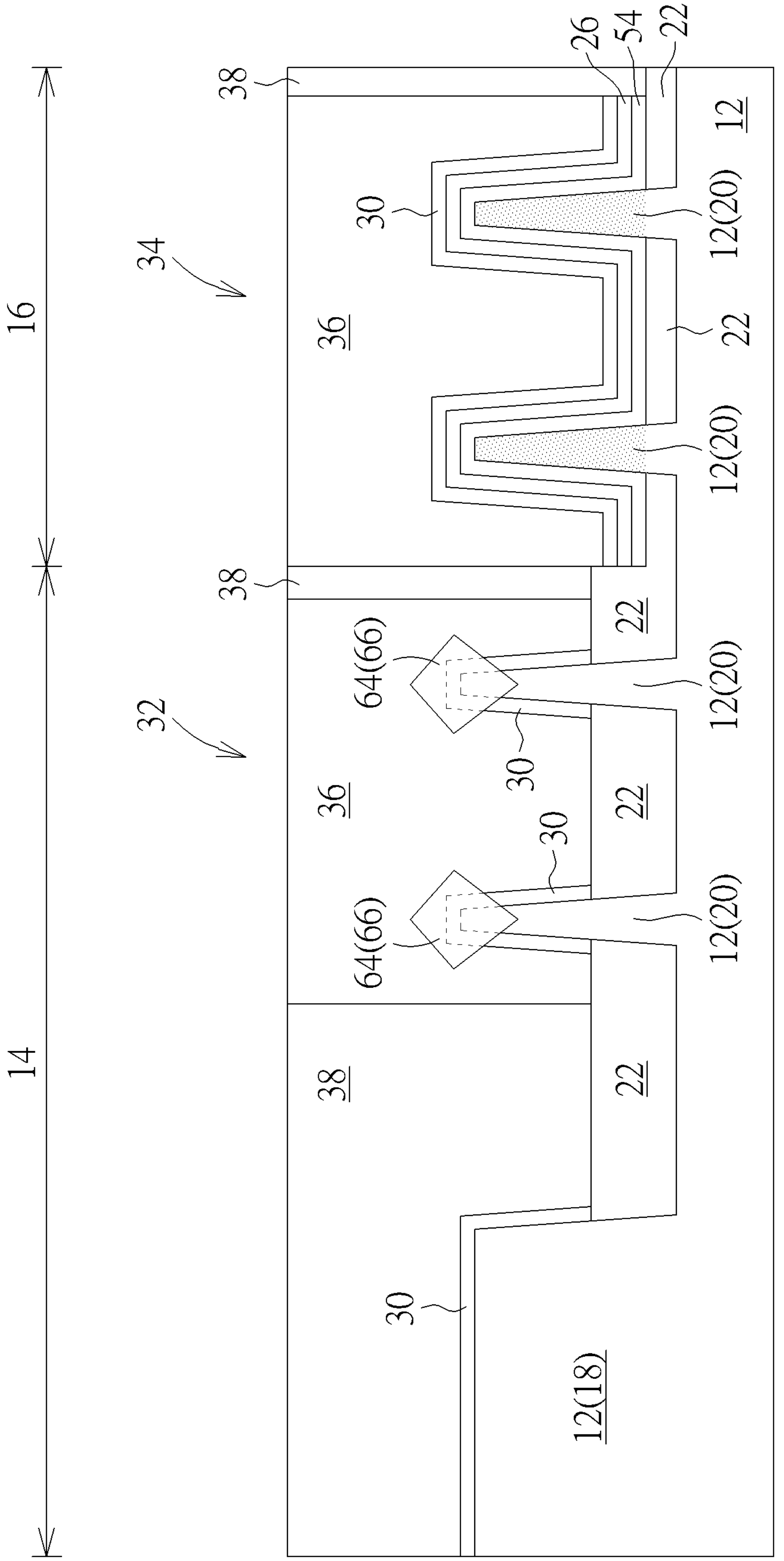

Next, as shown in FIG. 8, gate electrodes 32, 34 are formed on the substrate 12 and fin-shaped structures 20 on the non-MOSCAP region 14 and MOSCAP region 16 respectively, in which the gate electrode 32 formed on the non-MOSCAP region 14 could be served as gate electrode for I/O device or LV device, the gate electrode 34 formed on the MOSCAP region 16 could be used as top electrode for the MOSCAP device, and the formation of the gate electrodes 32, 34 could be accomplished by a gate first process, a high-k first approach from gate last process, or a high-k last approach from gate last process.

Since this embodiment pertains to a high-k last approach, a gate material layer 36 made of polysilicon and a selective hard mask (not shown) could be formed sequentially on the substrate 12, and a photo-etching process is then conducted by using a patterned resist (not shown) as mask to remove part of the gate material layer 36 and part of the gate oxide layer 30 through single or multiple etching processes. After stripping the patterned resist, gate electrodes 32, 34 each made of a patterned material layer 36 is formed on the substrate 12 and fin-shaped structures 20 of the non-MOSCAP region 14 and MOSCAP region 16.

Next, at least a spacer (not shown) is formed on the sidewalls of the each of the gate electrodes 32, 34, a source/drain region 64 and/or epitaxial layer 66 is formed in the fin-shaped structures 20 and/or substrate 12 adjacent to two sides of the spacer on the non-MOSCAP region 14, and selective silicide layers (not shown) could be formed on the surface of the source/drain region 64 and/or epitaxial layer 66. In this embodiment, the spacer could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof.

The source/drain region 64 and the epitaxial layer 66 could include different dopants or different materials depending on the type of device being fabricated. For instance, the source/drain region 64 could include n-type dopants or p-type dopants and the epitaxial layers 66 could include silicon germanium (SiGe), silicon carbide (SiC), or silicon phosphide (SiP). It should be noted that since a capacitor is fabricated on the MOSCAP region 16, no source/drain region and/or epitaxial layer is formed on the fin-shaped structures 20 adjacent to two sides of the gate electrode 34 on the MOSCAP region 16.

Next, an interlayer dielectric (ILD) layer 38 is formed on the gate electrodes 32, 34 and a planarizing process such as CMP is conducted to remove part of the ILD layer 38 for exposing the gate material layers 36 or gate electrodes 32, 34 made of polysilicon so that the top surface of the gate electrodes 32, 34 are even with the top surface of the ILD layer 38.

Figure 9:
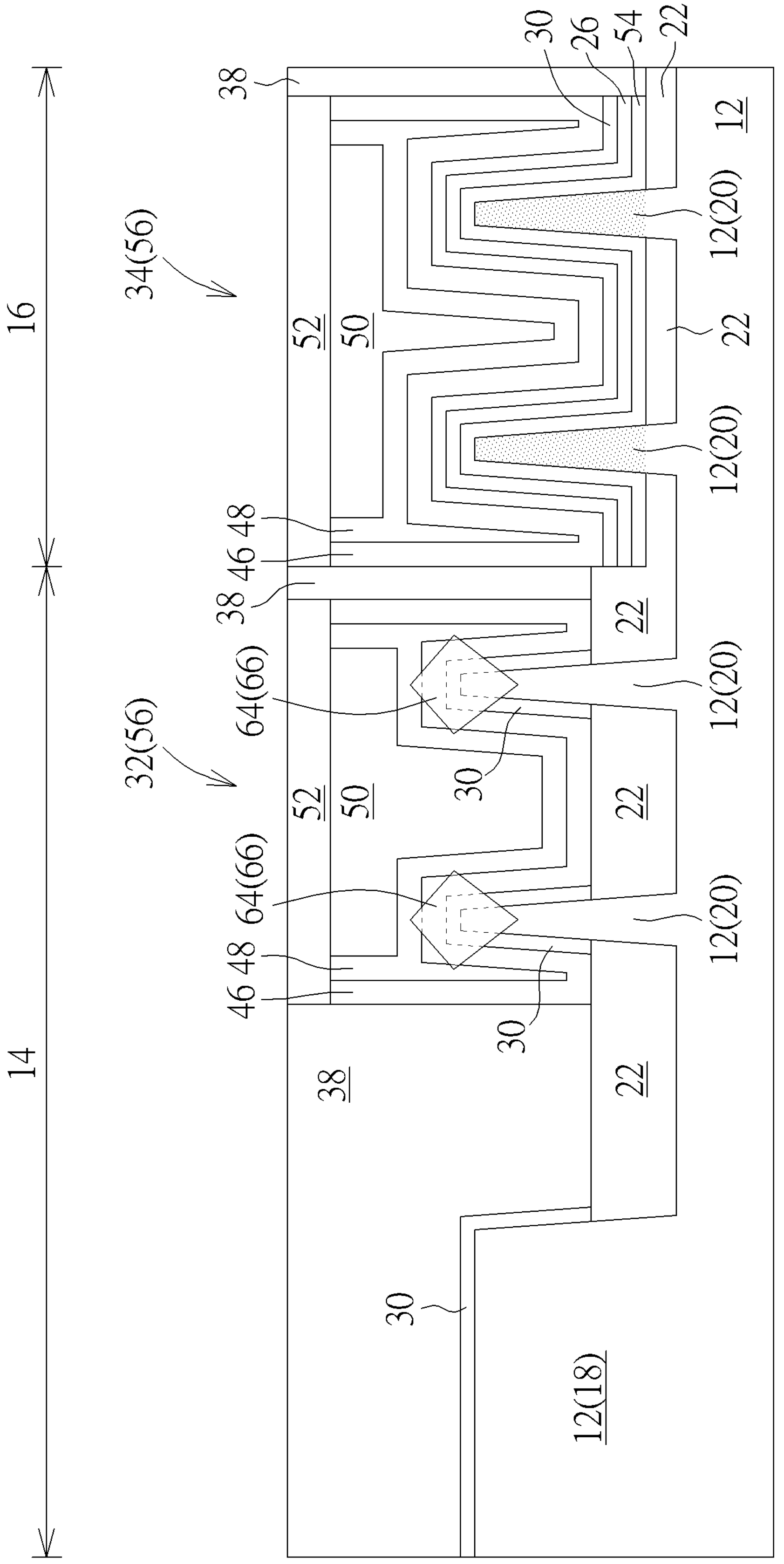

Next, as shown in FIG. 9, a replacement metal gate (RMG) process is conducted to transform the gate electrodes 32, 34 on the non-MOSCAP region 14 and MOSCAP region 16 into metal gates 56. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 36 and even gate oxide layer 30 for forming recesses (not shown) in the ILD layer 38.

Next, a selective interfacial layer (not shown) or gate dielectric layer, a high-k dielectric layer 46, a work function metal layer 48, and a low resistance metal layer 50 are formed in the recesses, and a planarizing process such as CMP is conducted to remove part of low resistance metal layer 50, part of work function metal layer 48, and part of high-k dielectric layer 46 to form metal gates 56. In this embodiment, the gate structures or metal gates 56 fabricated through high-k last process of a gate last process preferably includes an interfacial layer or gate oxide layer 30, a U-shaped high-k dielectric layer 46, a U-shaped work function metal layer 48, and a low resistance metal layer 50.

In this embodiment, the high-k dielectric layer 46 is preferably selected from dielectric materials having dielectric constant (k value) larger than 4. For instance, the high-k dielectric layer 50 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 48 is formed for tuning the work function of the metal gate in accordance with the conductivity of the device. For an NMOS transistor, the work function metal layer 48 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 48 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 48 and the low resistance metal layer 50, in which the material of the barrier layer may include titanium (Ti), titanium nitride (TiN), tantalum (Ta) or tantalum nitride (TaN). Furthermore, the material of the low-resistance metal layer 50 may include copper (Cu), aluminum (Al), titanium aluminum (TiAl), cobalt tungsten phosphide (CoWP) or any combination thereof.

Next, part of the high-k dielectric layer 46, part of the work function metal layer 48, and part of the low resistance metal layer 50 are removed to form recesses (not shown), and a hard mask 52 is formed into each of the recesses so that the top surfaces of the hard masks 52 and the ILD layer 38 are coplanar. Preferably the hard masks 52 could include $SiO_2$, SiN, SiON, SiCN, or combination thereof.

Next, a photo-etching process is conducted by using a patterned mask (not shown) as mask to remove part of the ILD layer 38 adjacent to the gate electrode 32 on the non-MOSCAP region 14 for forming contact holes (not shown) exposing the source/drain region underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs (not shown) electrically connecting the source/drain region. This completes the fabrication of a semiconductor device according to an embodiment of the present invention.

Figure 10:
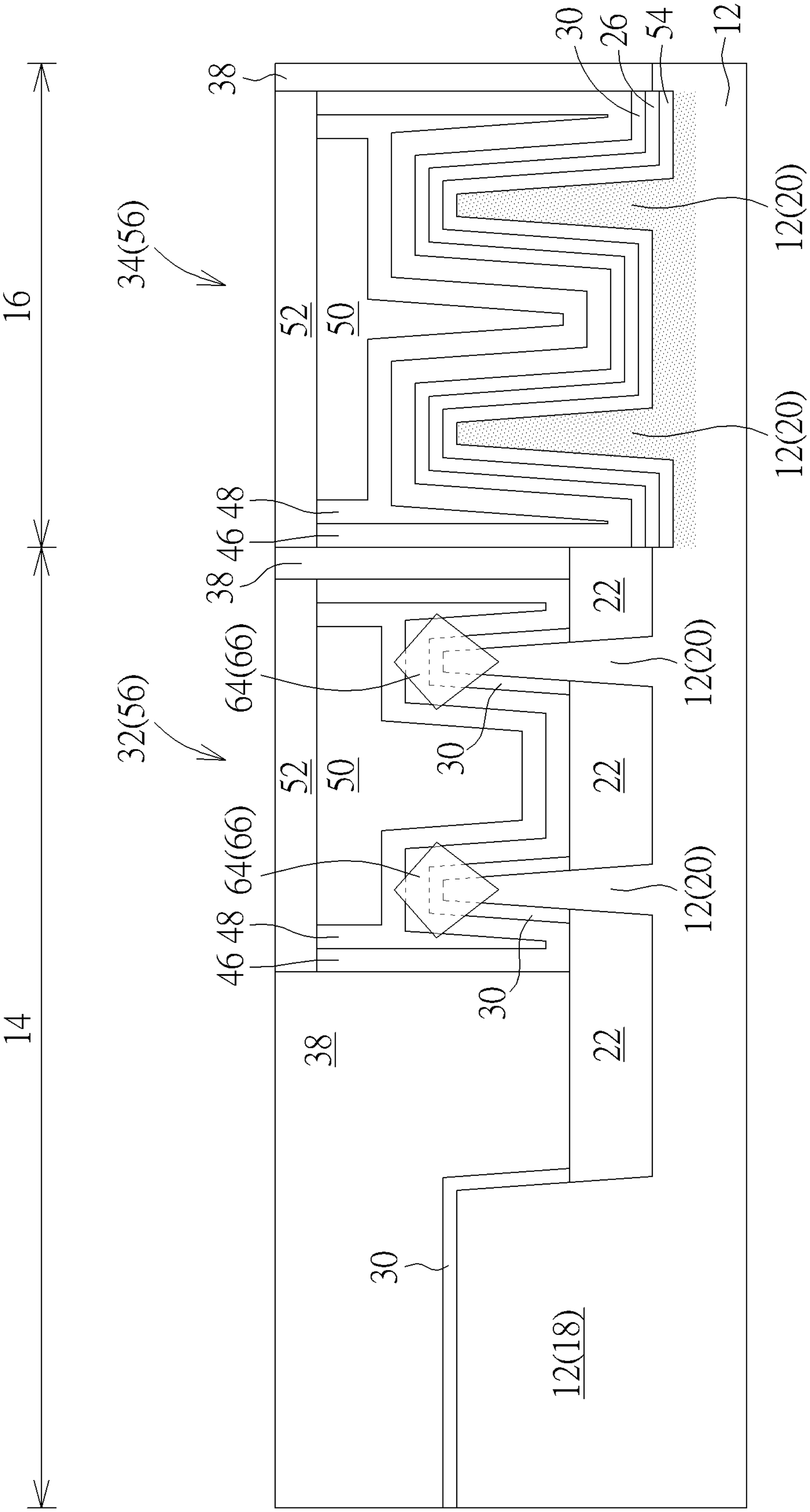
FIG. 10 illustrates a structural view of a semiconductor device according to an embodiment of the present invention.

Referring to FIG. 10, FIG. 10 illustrates a structural view of a semiconductor device according to an embodiment of the present invention. As shown in FIG. 10, the semiconductor device includes a substrate 12 having a non-MOSCAP region 14 and a MOSCAP region 16, a MOS transistor disposed on the non-MOSCAP region 14, and a MOSCAP device disposed on the MOSCAP region 16. In this embodiment, the MOSCAP device includes a plurality of fin-shaped structures 20 disposed on the substrate 12, at least an insulating layer such as a combination of the gate oxide layer 30 and/or high-k dielectric layer 46 on the fin-shaped structures 20, and a gate electrode 34 disposed on the gate oxide layer 30. Preferably, the heavily doped fin-shaped structures 20 are served as a bottom electrode for the MOSCAP device, dielectric layers including the gate oxide layer 30 and/or high-k dielectric layer 46 are served as a capacitor dielectric layer for the MOSCAP device, and the gate electrode 34 is served as a top electrode for the MOSCAP device.

Despite the fin-shaped structures 20 on the non-MOSCAP region 14 and MOSCAP region 16 are fabricated through same process, the overall and/or maximum doping concentrations of the fin-shaped structures 20 on the non-MOSCAP region 14 however are both less than overall and/or maximum doping concentrations of the fin-shaped structures 20 on the MOSCAP region 16. In contrast to having STI 22 disposed between the fin-shaped structures 20 on the MOSCAP region 16 in the aforementioned embodiment, it would be desirable to completely remove the STI 22 on the MOSCAP region 16 when part of the STI 22 on the non-MOSCAP region 14 and MOSCAP region 16 are removed to form a step height during the processes conducted in FIGS. 1-3, and then conduct the follow-up process shown in FIGS. 4-9 by forming gate oxide layer 30 and gate electrodes 32, 34 on the non-MOSCAP region 14 and MOSCAP 16. In contrast to the doped region shown in FIG. 9 is only disposed in the fin-shaped structures 20, the dopants in this embodiment are not only driven into the fin-shaped structures 20 but also part of the substrate 12 underneath the fin-shaped structures 20 through anneal process 28 and diffusion due to the absence of the STI 22. In other words, the capacitor bottom electrode made by the doped layer fin-shaped structures 20 on the MOSCAP region 16 is disposed not only within the fin-shaped structures 20 but also in the substrate 12 directly under and adjacent to two sides of the fin-shaped structures 20.

It should also be noted that when all of the STI 22 on the MOSCAP region 16 is removed, the surface of the substrate 12 defined outside the MOSCAP device is preferably slightly lower than the surface of the substrate 12 directly under the MOSCAP device. In other words, as viewed from a cross-section perspective, the surface of the substrate 12 adjacent to two sides of the two fin-shaped structures 20 on the MOSCAP region 16 is slightly lower than the surface of the substrate 12 between the two fin-shaped structures 20 while the surface of the substrate 12 between the two fin-shaped structures 20 is still even with the surface of the substrate 12 on the non-MOSCP region 14.

Since the step height formed on the surface of the substrate 12 on the MOSCAP region 16 is appeared before the formation of the gate electrode 34, after conducting the aforementioned process shown in FIGS. 4-9 the bottom surface of the gate electrode 34 between the two fin-shaped structures 20 on the MOSCAP region 16 would also be slightly higher than the bottom surface of the gate electrode 34 adjacent to two sides of the fin-shaped structures 20.

Moreover, since the gate electrode 32 on the non-MOSCAP region 14 and the gate electrode 34 on the MOSCAP region 16 are formed at the same time, the top surface of the gate electrode 32 is even with the top surface of the gate electrode 34 while the bottom surface of the gate electrode 32 is higher than the bottom surface of the gate electrode 34 between the two fin-shaped structures 20 on the MOSCAP region 16 as well as the bottom surface of the gate electrode 34 adjacent to two sides of the fin-shaped structures 20.

Overall, the present invention discloses an approach of fabricating a MOSCAP device, which first forms a STI around the fin-shaped structures on the non-MOSCAP region and MOSCAP region, conducts a first etching process to remove part of the STI on the MOSCAP region, and then conducts another etching process to remove part of the STI on both the non-MOSCAP region and MOSCAP region at the same time so that a height difference is created between the STI on the two regions as the remaining height of the STI on the MOSCAP region is slightly lower than the remaining height of the STI on the non-MOSCAP region. By adjusting the height of the STI on the MOSCAP region, it would be desirable to adjust the overall area and capacitance of the MOSCAP device such that better compatibility between the transistor and MOSCAP device could be achieve.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:

providing a substrate having a non-metal-oxide semiconductor capacitor (non-MOSCAP) region and a MOSCAP region;

forming a fin-shaped structure on the MOSCAP region;

forming a shallow trench isolation (STI) around the substrate and the fin-shaped structure;

performing a first etching process to remove part of the STI on the MOSCAP region; and performing a second etching process to remove part of the STI on the non-MOSCAP region and the MOSCAP region immediately after the first etching process.

2. The method of claim 1, further comprising:

forming a doped layer on the non-MOSCAP region and the MOSCAP region;

forming a cap layer on the doped layer;

removing the cap layer and the doped layer on the non-MOSCAP region;

performing an anneal process;

forming a gate oxide layer on the substrate on the non-MOSCAP region and the fin-shaped structure on the MOSCAP region; and forming a first gate electrode on the non-MOSCAP region and a second gate electrode on the MOSCAP region.

3. The method of claim 2, further comprising performing the anneal process to drive dopants from the doped layer into the fin-shaped structure.

4. The method of claim 2, wherein the doped layer comprises phosphosilicate glass (PSG).

5. The method of claim 1, wherein a top surface the STI on the MOSCAP region is lower than a top surface of the STI on the non-MOSCAP region.

6. The method of claim 1, wherein the non-MOSCAP region comprises an input/output (I/O) region.

7. The method of claim 1, wherein the non-MOSCAP region comprises a low-voltage (LV) region.

* * * * *